(12) United States Patent
Roesner et al.

(10) Patent No.: US 9,496,193 B1
(45) Date of Patent: Nov. 15, 2016

(54) SEMICONDUCTOR CHIP WITH STRUCTURED SIDEWALLS

(71) Applicant: Infineon Technologies AG, Neubiberg (DE)

(72) Inventors: Michael Roesner, Villach (AT); Gudrun Stranzl, Goedersdorf (AT); Martin Zgaga, Rosegg (AT); Martin Sporn, Villach (AT); Tobias Schmidt, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/858,633

(22) Filed: Sep. 18, 2015

(51) Int. Cl.
| | |
|---|---|
| H01L 23/04 | (2006.01) |
| H01L 21/48 | (2006.01) |
| H01L 21/78 | (2006.01) |
| H01L 21/56 | (2006.01) |
| H01L 23/31 | (2006.01) |
| H01L 23/12 | (2006.01) |
| H01L 23/00 | (2006.01) |

(52) U.S. Cl.
CPC ............ H01L 23/04 (2013.01); H01L 21/4803 (2013.01); H01L 21/56 (2013.01); H01L 21/78 (2013.01); H01L 23/12 (2013.01); H01L 23/3157 (2013.01); H01L 24/26 (2013.01); H01L 24/32 (2013.01)

(58) Field of Classification Search
CPC ........ H01L 24/26; H01L 24/27; H01L 24/32
See application file for complete search history.

(56) References Cited

U.S. PATENT DOCUMENTS

| | | | |
|---|---|---|---|
| 6,867,481 B2 | 3/2005 | Joshi et al. | |
| 7,319,266 B2 | 1/2008 | St. Germain et al. | |
| 7,420,262 B2 | 9/2008 | Bauer et al. | |
| 7,768,102 B2 * | 8/2010 | Risaki | H01L 24/83 257/622 |
| 8,329,509 B2 | 12/2012 | Gong et al. | |
| 8,674,482 B2 | 3/2014 | Shi et al. | |
| 8,803,300 B2 | 8/2014 | Bathan et al. | |
| 2004/0157410 A1 * | 8/2004 | Yamaguchi | H01L 23/49805 438/460 |
| 2008/0217744 A1 * | 9/2008 | Murakami | H01L 23/142 257/622 |
| 2012/0061856 A1 * | 3/2012 | Vora | H01L 24/16 257/782 |

* cited by examiner

*Primary Examiner* — Alonzo Chambliss
(74) *Attorney, Agent, or Firm* — Dicke, Billig & Czaja, PLLC

(57) ABSTRACT

A semiconductor chip includes a body having a frontside, a backside opposite the frontside, and sidewalls extending between the backside and frontside, at least a portion of each sidewall having a defined surface structure with hydrophobic characteristics to inhibit travel of a bonding material along the sidewalls during attachment of the semiconductor chip to a carrier with the bonding material.

23 Claims, 11 Drawing Sheets

SEMICONDUCTOR CHIP WITH STRUCTURED SIDEWALLS

BACKGROUND

When assembly semiconductor components, semiconductor chips, or dies, are typically attached to a carrier, such as a leadframe, using some type of soldering process (e.g. using soft solder, solder paste, diffusion solder). During such soldering processes, the semiconductor chips are typically pressed onto a liquid solder material (or other bonding material) placed on the carrier, resulting in solder material being squeezed out from the interstices between the semiconductor chips and the carrier about the perimeter of the chips. Due to adhesion forces, the squeezed-out solder material tends to travel or creep up the sidewalls of the chips, such as from the chip backside toward the chip front side. Chemicals from the solder material (e.g. metals, flux agents) can diffuse into and contaminate the bulk semiconductor material on the chip sidewalls, and can lead to degradation and failure of active regions of the semiconductor chip adjacent to the sidewalls.

To eliminate such solder creepage, conventional die attach processes attempt to optimize process windows, wherein the amount of solder and the amount of force applied to the chip are each minimized. However, such process windows are narrow and can fluctuate based on process conditions and, as a result, fail to solder creepage.

For these and other reasons, there is a need for the teachings of the present disclosure.

SUMMARY

One example provides a semiconductor chip including a body having a frontside, a backside opposite the frontside, and sidewalls extending between the backside and frontside, at least a portion of each sidewall having a defined surface structure with hydrophobic characteristics to inhibit travel of a bonding material along the sidewalls during attachment of the semiconductor chip to a carrier with the bonding material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" does not mean means that the elements must be directly coupled together, but that intervening elements may be provided between the "electrically coupled" elements.

Semiconductor assembly processes typically include the attaching of semiconductor chips to carriers, such as leadframes, using soldering processes which result in the vertical migration of liquid solder material up chip sidewalls. Such solder migration, or creepage, can damage the semiconductor material along the sidewalls of the chips and damage adjacent integrated circuits leading to chip degradation and failure.

Figure 1:
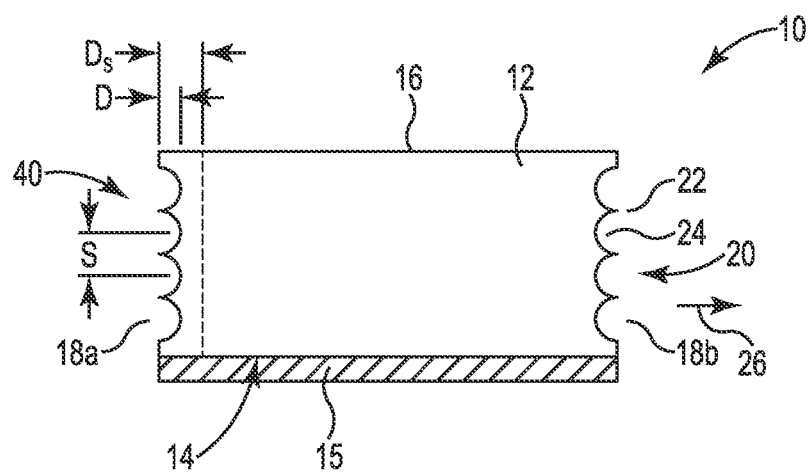
FIG. 1 is a cross-sectional view generally illustrating a semiconductor chip according to one example of the present disclosure.

FIG. 1 is a cross-sectional view illustrating a semiconductor chip 10 having sidewalls with a defined surface structure for inhibiting or preventing travel of bonding material, such as solder, up the chip sidewalls during die attach, according to one example of the present disclosure. Semiconductor chip 10 includes a body 12 of semiconductor material (e.g. crystalline silicon) having a first major surface 14 (e.g. a backside), a second major surface 16 (e.g. a frontside), and a plurality of sidewalls 18, such as sidewalls 18a and 18b, extending between backside 14 and frontside 16. In one example, backside 14 includes an electrode 15.

Sidewalls 18 have a defined surface structure 20 extending from backside 14 toward front side 16 which is configured to reduce the wettability of sidewalls 18 relative to conventional planar sidewalls to thereby inhibit the vertical travel of liquid bonding material, such as molten solder, along sidewalls 18 during attachment. As used herein, the term wettability is defined as the ability of a liquid to maintain contact with a solid surface.

Figure 2:
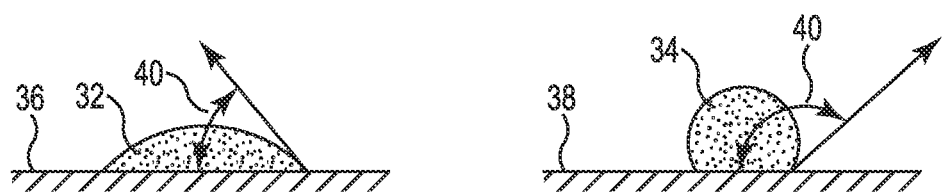
FIG. 2 are cross-sectional views generally illustrating liquid drops on hydrophilic and hydrophobic surfaces.

FIG. 2 is schematic diagram generally illustrating examples of drops of liquid 32 and 34, such as water, on surfaces 36 and 38. A solid-liquid contact angle 40, or simply the contact angle, is defined as the interface angle, or angle formed between the drop and surface, as measured through the liquid drop. As illustrated by drop 32, contact angle 40 of drop 32 with surface 36 is less than or equal to 90 degrees such that surface 36 is considered hydrophilic, or a surface that "attracts" liquid. In contrast, as illustrated by drop 34, contact angle 40 of drop 34 with surface 38 is greater than 90 degrees such that surface 38 is considered hydrophobic, or a surface that "sheds" water.

Returning to FIG. 1, according to one example, to reduce the wettability of sidewalls 18, surface structure 20 is a hydrophobic surface structure configured to form contact angles (sometimes referred to as a wetting angle) of greater than 90 degrees with liquids coming into contact therewith, so as to provide sidewalls 18 with hydrophobic characteristics that resist vertical creepage of bonding materials when in a liquid state. In one example, defined surface structure 20 includes features transitioning between pluralities of high points 22 and low points 24, as measured in a direction 26 normal to the corresponding sidewall 18, such that surface structure 20 provides solid-liquid contact angles to inhibit vertical travel of liquid bonding material along sidewalls 18 from backside 14 to frontside 16 during die attach.

In one example, the features of surface structure 20 have a defined spatial modulation, including a spacing "S" and a depth "D", that can be varied based on expected properties of a particular bonding material when in a liquid state, such as the viscosity, and on a contact or wetting angle desired to be achieved. For instance, in one example, the lower the expected viscosity of the bonding material when in the liquid state (more water-like), the smaller the spacing, S, and the less the depth, D, of the spatial modulation of the features of surface structure 20. Similarly, the higher the expected viscosity of the bonding material when in the liquid state (less water-like), the greater the spacing, S, and the greater the depth, D, of the spatial modulation of the features of surface structure 20. In one example, as illustrated in FIG. 1, the depth, D, of the features of the surface structure 20 is less than a depth, Ds, of an electrically inactive portion of the material (e.g. silicon) of body 12 of semiconductor chip 10, so that the features of surface structure 20 do not interfere with the active portion of chip 10.

Figure 3:
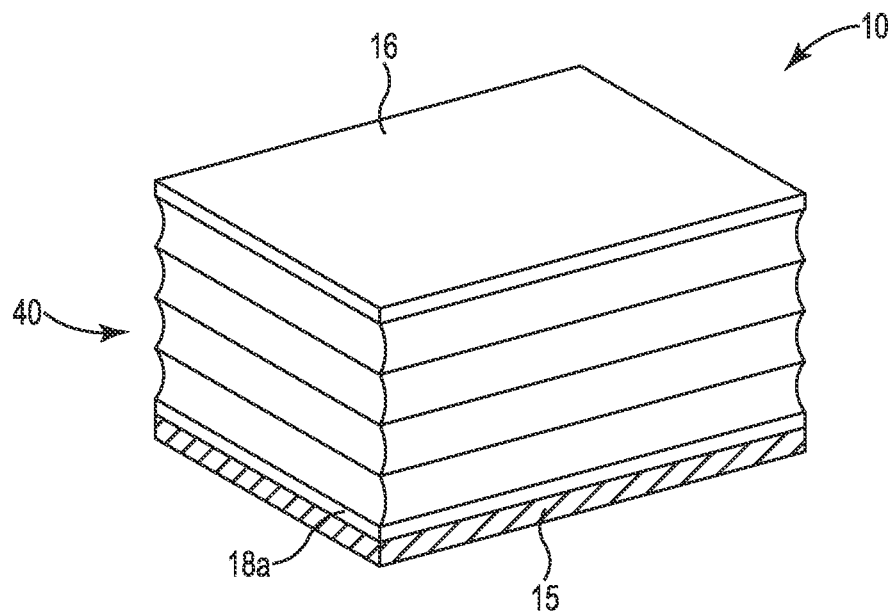
FIG. 3 is a perspective view generally illustrating a semiconductor chip according to one example of the present disclosure.

According to one example, surface structure 20 forms a corrugated surface extending laterally across each sidewall 18. In one example, as illustrated by FIG. 3, and by FIG. 1, the corrugated surface formed by surface structure 20 comprises a plurality of scallop features 40 extending laterally across sidewalls 18 of semiconductor chip 10. As described above, a spacing and depth of scallop features 40 can be adjusted based on the expected liquid properties of the bonding material to be used to attach semiconductor chip 10 to a carrier. In one example, as described in greater detail below, scallop features 40 of surface structure 20 are formed using a Bosch deep reactive-ion etching (DRIE) process.

Figure 4:
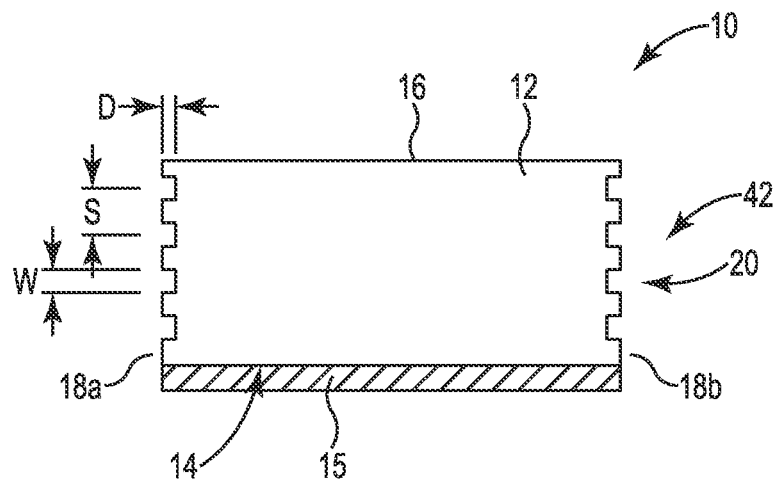
FIG. 4 is a cross-sectional view generally illustrating a semiconductor chip according to one example of the present disclosure.

As illustrated by FIG. 4, in another example, the corrugated surface formed by surface structure 20 comprises a plurality of channels or grooves 42 extending laterally across sidewalls 18 of semiconductor chip 10. Similar to that described above, a width, depth, and spacing of grooves 40 can be adjusted based on the expected liquid properties of the bonding material to be used to attach semiconductor chip 10 to a carrier. In one example, grooves 40 may be formed by scratching sidewalls 18, such as with a nanoindentation tool, for instance.

Figure 5:
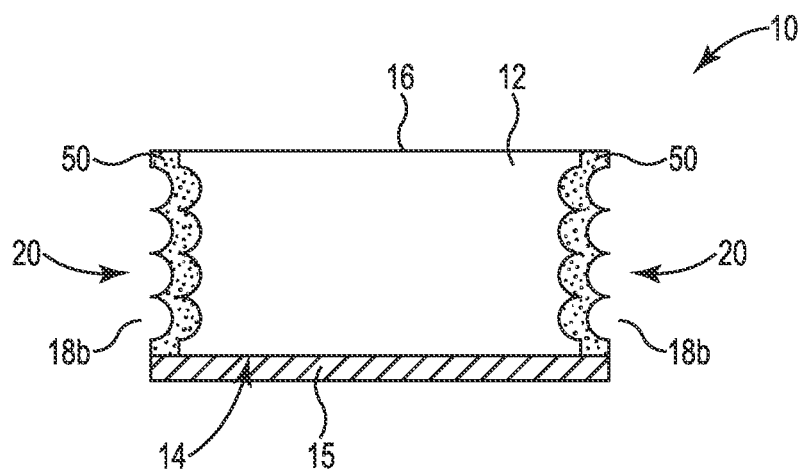
FIG. 5 is a cross-sectional view generally illustrating a semiconductor chip according to one example of the present disclosure.

In one example, as illustrated by FIG. 5, surface structure 20 is coated with a protective layer 50. In one example, protective layer 50 comprises a diffusion barrier to prevent diffusion of contaminants into the semiconductor material of body 12 via sidewalls 18 from bonding materials used to attach semiconductor chip 10 to a carrier during later semiconductor component assembly processes, such as metals from solder materials, for example. Protective layer 50 may comprise any number of suitable materials, such as metal oxides and polymer-nitride-carbon, for example.

According to one example, protective layer 50 may comprise the same material as used to form backside electrode 15. For instance, according to one example, backside electrode 15 and protective layer 50 are a contiguous layer applied using sputtering processes and comprising a four layer stack of aluminum, titanium, nickel-vanadium, and gold-tin, wherein the titanium layer serves as a diffusion barrier. In one example, the four-layer stack is a 400 nm layer of aluminum deposited on body 12, a 400 nm layer of titanium deposited on the aluminum layer, a 200-400 nm layer of nickel-vanadium deposited on the titanium layer, and a 1 um gold-tin layer deposited on the nickel-vanadium layer. In one example, protective layer 50 comprises a layer of oxide or nitride material.

Figure 6:
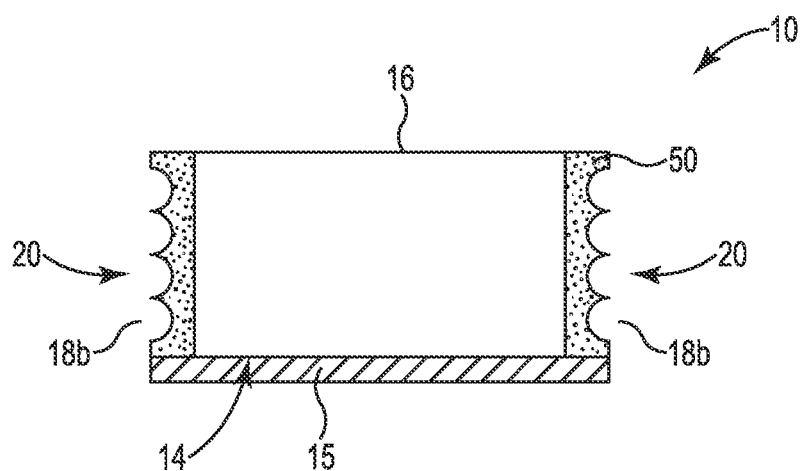
FIG. 6 is a cross-sectional view generally illustrating a semiconductor chip according to one example of the present disclosure.

As illustrated by FIG. 6, according to one example, in lieu of forming surface structure 20 in the semiconductor material of body 12 and then coating with protective layer 50, the sidewalls 18 of semiconductor chip 10 are first coated with protective layer 50, and surface structure 20 is formed in the material of protective layer 50.

Figure 7A:
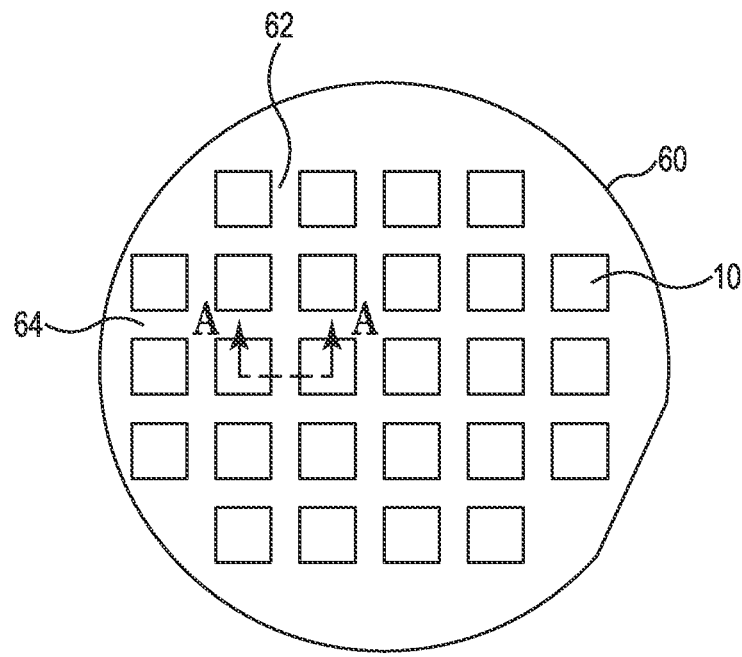
FIG. 7A is a top view generally illustrating a semiconductor wafer according to one example.

FIGS. 7A through 7H illustrate generally a method employing a Bosch step-wise etching process for forming a semiconductor chip with sidewalls having a defined surface structure, such as semiconductor chip 10 of FIG. 1 (and FIG. 3), according to one example of the present disclosure. FIG. 7A is a top view generally illustrating a semiconductor wafer 60 including a plurality of integrated circuit regions forming semiconductor chips 10 prior to being separated or singulated therefrom. Semiconductor chips 10 are spaced from one another by vertical and horizontal streets 62, 64 which do not contain integrated circuits and are designed as locations along which wafer 60 will be diced into individual chips.

Figure 7B:
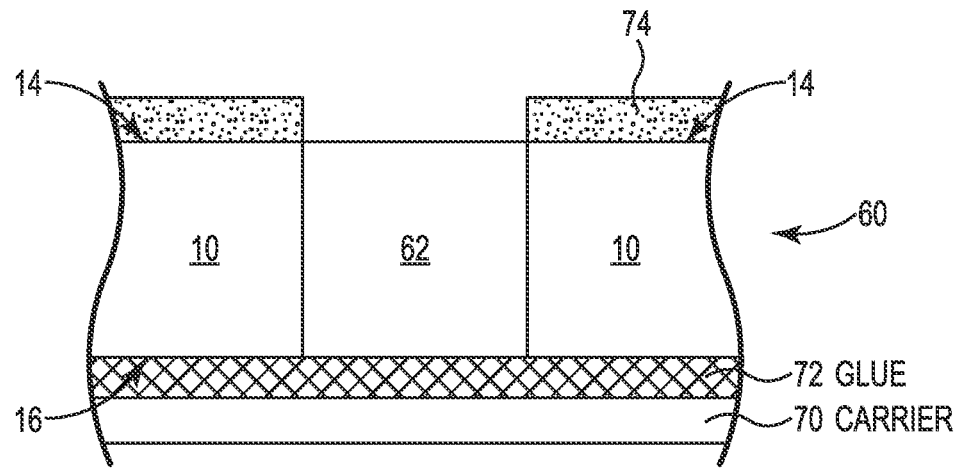
FIGS. 7B-7G are cross-sectional views generally illustrating a method of forming a semiconductor chip from the semiconductor wafer of FIG. 7A according to one example of the present disclosure.

FIG. 7B is a cross-sectional view of a portion of semiconductor wafer 60 along section A-A of FIG. 7A, wherein semiconductor wafer 60 has been mounted to a carrier 70 with a bonding material 72 (e.g. adhesive tape) such that the frontsides 16 of chips 10 are facing carrier 70. A mask 74, such as an oxide material, is disposed so as to cover the backsides 14 of semiconductor chips 10, leaving dicing vertical dicing streets 62, as well as horizontal dicing streets 64, uncovered.

Figure 7C:
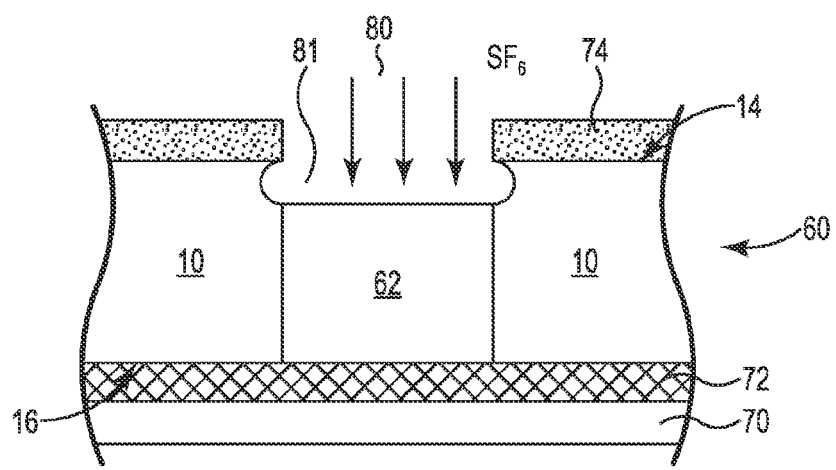

At FIG. 7C, a first anisotropic etch step using a plasma 80 is carried out, which removes a first portion of the material of street 62 and a portion of the material of body 12 of what will become chip 10 to form a trench 81 and to form a first scallop feature 83 of the defined surface structures 20 of sidewalls 18 of chips 10. According to one example, when wafer 60 and, thus, body 12 of chip 10 comprise silicon, plasma 80 is a fluorine-based plasma, such as sulfur hexafluoride ($SF_6$).

Figure 7D:
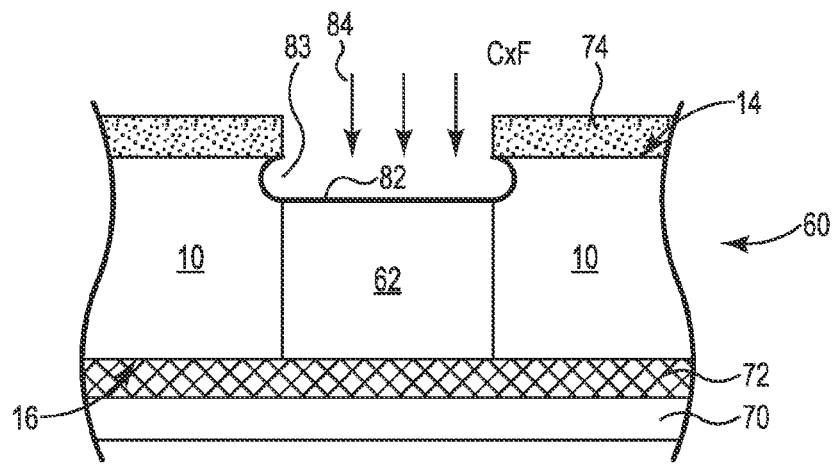

At FIG. 7D, after the first etch is performed, a chemically inert passivation layer 82 is deposited on the bottom and sides of trench 81 (i.e., exposed portions of the material of street 62 and sidewalls 18 of semiconductor chips 12). According to one example, passivation layer 82 is a polymer material which is deposited using a fluorocarbon-based source gas 84, such octafluorocyclobutante ($C_4F_8$).

Figure 7E:
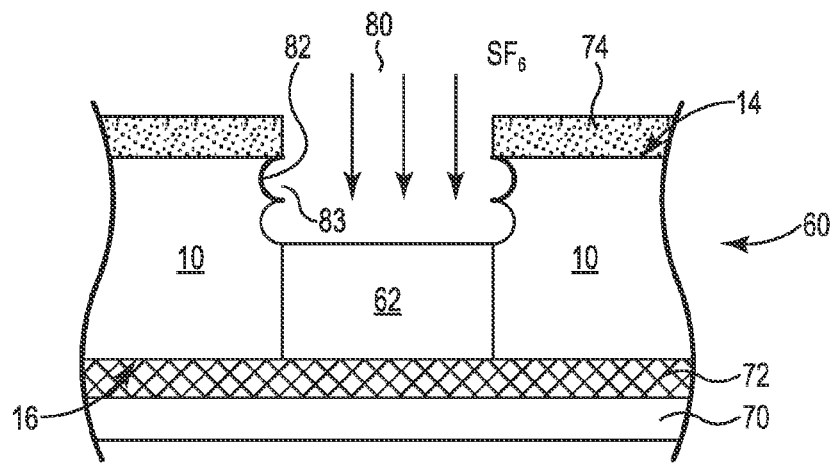

At FIG. 7E, after deposition of passivation layer 82, another etch step is performed using plasma 80. Initially, plasma 80 removes passivation layer 82 at the bottom of trench 81, ions from plasma 80 sputter off the bottom of trench 81 and form another scallop feature of the defined surface structure 20 of sidewalls 18 of chips 10. The process of FIGS. 7D and 7E are repeated until all of the material of street 62 is removed (as well as that of streets 64), and semiconductor chips 10 are separated from semiconductor wafer 60.

With reference to FIG. 1, in order to adjust the depth D and spacing S of the scallop features 40 of defined surface structure 20, the etching times used during the plasma etching steps (e.g. FIGS. 7C and 7E) can be controlled. For example, the duration of the etching steps are increased to form deeper scallops having a greater spacing (i.e. width of each scallop feature), and decreased to form shallower scallops with lesser spacing. As described above, according to one example, the depth D and spacing of the scallop features and, thus, a duration of the etching steps, is adjusted based on liquid state properties (e.g. surface tension, viscosity) of a bonding material, such as solder, used to attach semiconductor chip 10 to a carrier (e.g., see FIGS. 8A and 8B below).

Figure 7F:
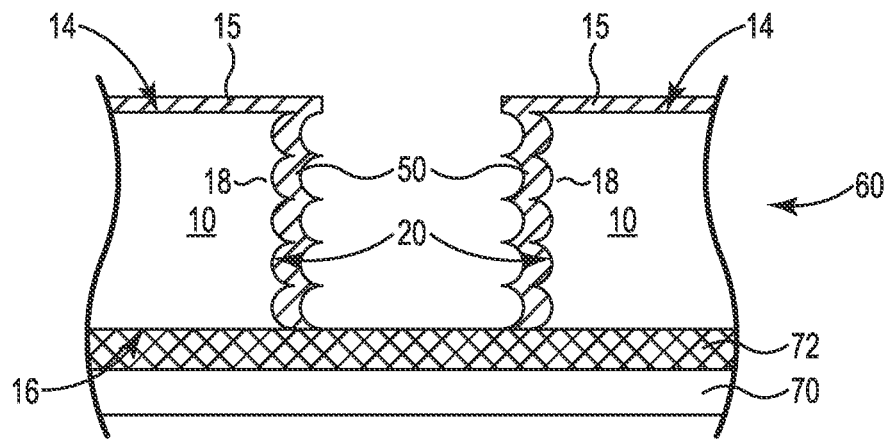
Figure 7G:
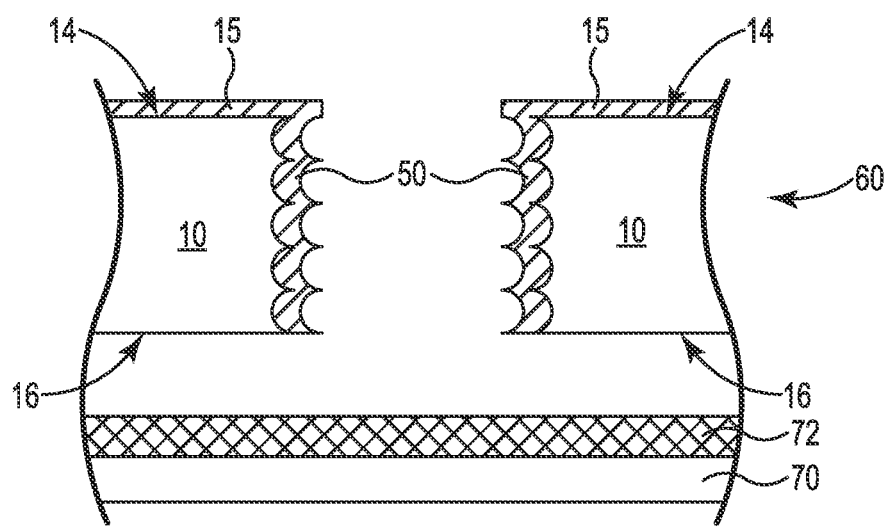

With reference to FIG. 7F, after etching has been completed, protective layer 50 is deposited on sidewalls 18 over defined surface structure 20 and on backsides 14 to form backside electrode 15. In other examples, as described above, the material of protective layer 50 may be different than that of backside electrode 15. In other examples, semiconductor chips 10 may not include a backside electrode 50, such that protective layer 50 is deposited only on sidewalls 18 of semiconductor chips 10. As illustrated by FIG. 7G, after deposition of protective layer 50, and/or backside electrode 15, semiconductor chips 10 are removed from carrier 70.

Although illustrated above as being separated from semiconductor wafer 60 using a Bosch etching process, it is noted that any other suitable process may be used to separate semiconductor chips 10 from wafer 60 while simultaneously forming defined surface structure 20 on sidewalls 18 thereof. For example, in one instance, wet chemical etching processes may be employed for such purpose.

Figure 8A:
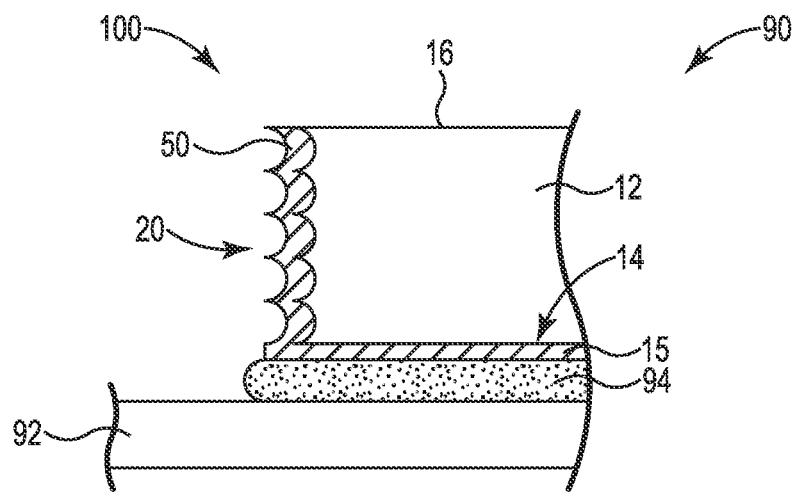
FIGS. 8A-8B are cross-sectional views generally illustrating mounting of a semiconductor chip on a carrier according to one example of the present disclosure.

According to one example, as illustrated by FIG. 8A, during later assembly of a semiconductor component 90, backside electrode 15 of semiconductor chip 10 is attached to a carrier 92 using a bonding material 94, such as a solder material. As illustrated by FIG. 8A, semiconductor chip 10 is placed on a drop of liquid solder 94 disposed on carrier 92.

Figure 8B:
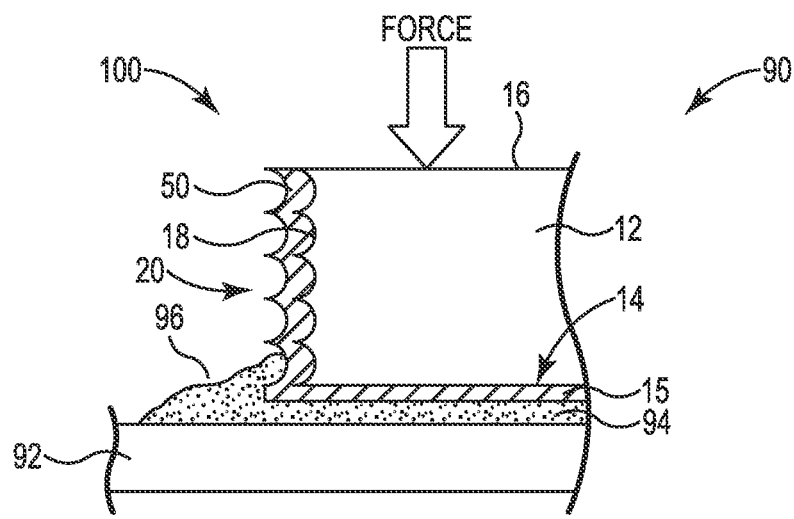

At FIG. 8B, a force F is applied to press semiconductor chip 10 onto liquid solder 94, resulting in solder squeeze-out 96 about the perimeter of semiconductor chip 10 on backside 14. Because of the hydrophobic properties provided by the physical characteristics of defined surface structure 20, defined surface structure 20 inhibits the travel of solder-squeeze-out 96 along sidewall 18 toward frontside 16.

Additionally, protective layer 50 prevents the diffusion of contaminants into the material of body 12 of semiconductor chip 10 from any solder material that does contact sidewall 18. As such, surface structure 20 and protective layer 50 together greatly reduce the chances of degradation of semiconductor chip 10 by creepage of bonding materials, such as solder, along the sidewalls of semiconductor chip 10 during die attach processes.

Figure 9A:
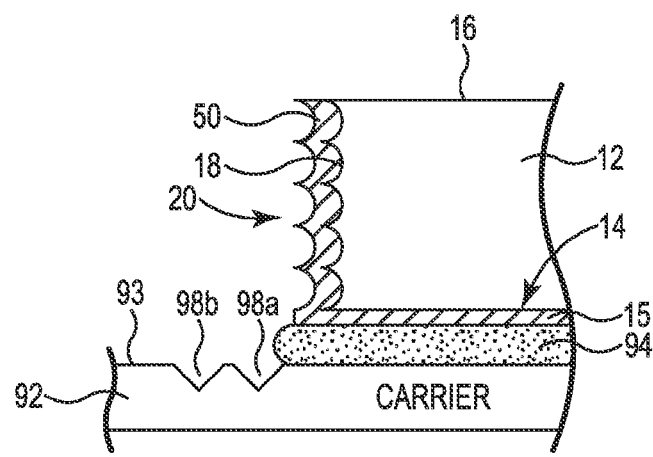
FIGS. 9A-9C are cross-sectional views generally illustrating mounting of a semiconductor chip on a carrier according to one example of the present disclosure.
Figure 9B:
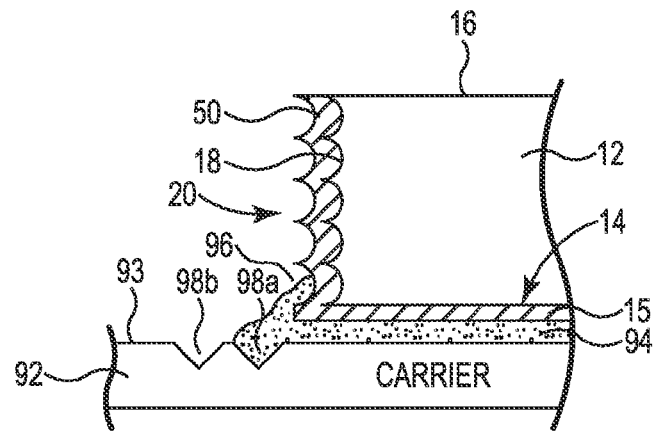
Figure 9C:
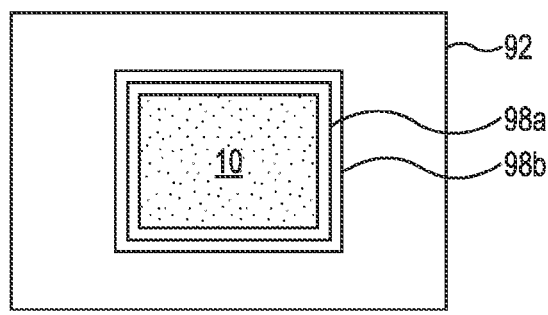

According to one example, as illustrated by FIGS. 9A through 9C, in addition to providing defined structure 20 on sidewalls 18 of semiconductor chip 10, one or more grooves 98, such as illustrated by grooves 98a and 98b, are formed in a surface 93 of carrier 90 about a perimeter of the attachment location of semiconductor chip 10 thereto. FIG. 9C is a top view illustrating grooves 98a and 98b extending in carrier 92 about the perimeter of semiconductor chip 10. Grooves 98 more be formed in carrier 92 using any suitable process (e.g. etching, stamping). For example, in a scenario where carrier 92 is formed of a copper material, grooves 98 may be formed via a stamping process during formation of carrier 92.

Figure 10A:
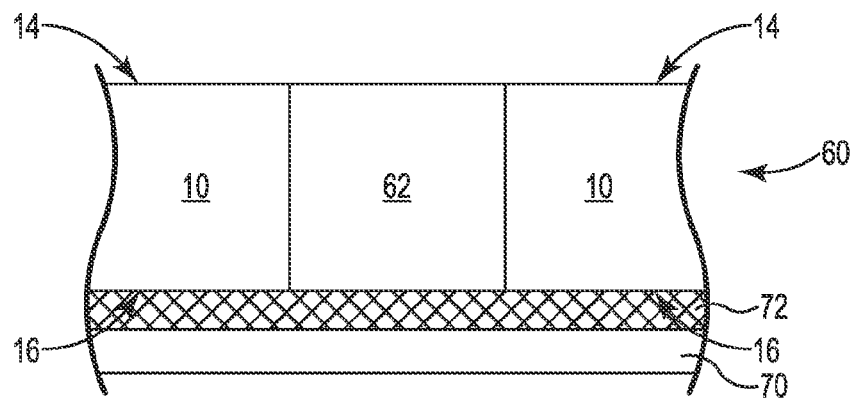
FIGS. 10A-10F are cross-sectional views generally illustrating a method of forming a semiconductor according to one example of the present disclosure.
Figure 10B:
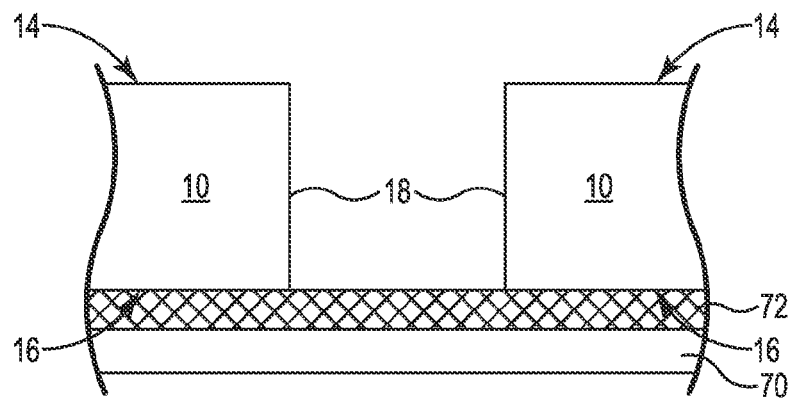

Grooves 98 serve as reservoirs to collect solder squeeze-out 96 from the interstice between semiconductor chip 10 and carrier 92 during attachment of semiconductor chip 10 thereto and inhibit the spread of solder squeeze-out 96 across surface 93. According to one example, grooves 98 collect solder squeeze-out 96 and enable a portion of solder squeeze-out 96 to remain in contact with at least a portion of sidewalls 18 of semiconductor chip 10, as it is sometimes desirable for As illustrated by FIGS. 10A-10F, surface structures 20 may also be formed using a Bosch stepwise etching process (or other etching process) in sidewalls 18 of semiconductor chips 10 after semiconductor chips 10 have already been separated from semiconductor wafer 60. FIG. 10A is a cross-sectional view of a portion of semiconductor wafer 60 after semiconductor wafer 60 has been mounted to carrier 70 with a bonding material 72, such as an adhesive tape, for example, with frontsides 16 of chips 10 facing carrier 70. FIG. 10B illustrates wafer 60 of FIG. 7B, after semiconductor chips 10 have been separated from wafer 60 along streets 62 such as by saw-cutting, or another conventional technique.

Figure 10C:
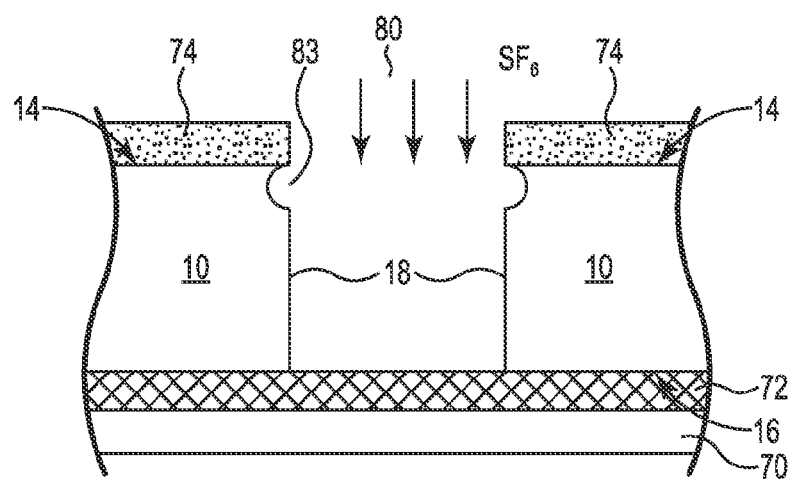

At FIG. 10C, a mask 64, such as an oxide hard mask, for example, is applied to cover backsides 14 of semiconductor chips 14. A first etching step using a plasma 80 (e.g. sulfur hexafluoride ($SF_6$)) is carried out to form a first scallop feature 83 of defined surface structure 20 in sidewall 18 of chips 10. At FIG. 10D, after the first etching step is completed, a chemically inert passivation layer 82 is deposited to cover first scallop feature 83 using a fluorocarbon-based source gas 84, such octafluorocyclobutante ($C_4F_8$), for example.

Figure 10D:
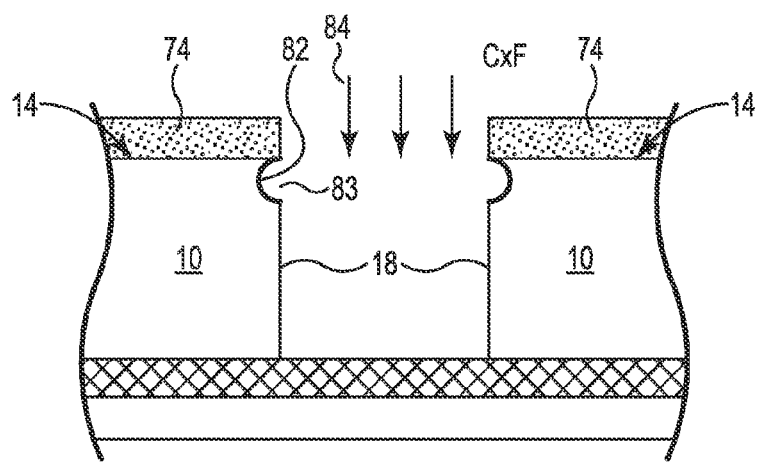
Figure 10E:
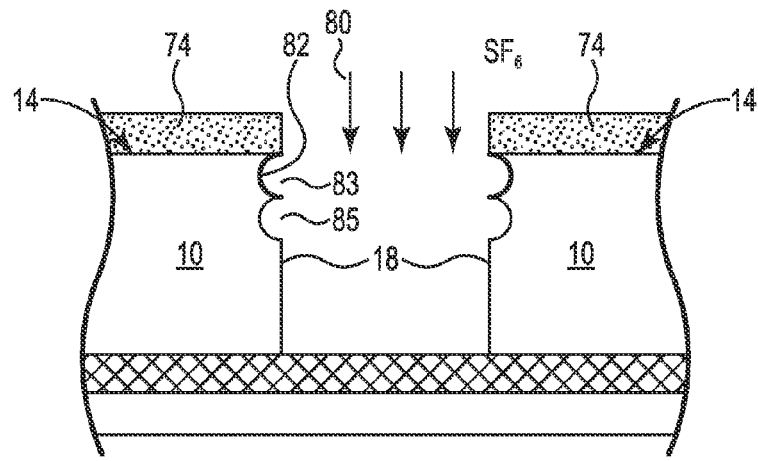

At FIG. 10E, after deposition of passivation layer 82, another etch step is performed and forms another scallop feature 85 of defined surface structure 20 in sidewall 18 of chips 10. The processes of FIGS. 10D and 10E are repeated until the desired number of scallop features (e.g. scallop features 83 and 85) are formed in sidewall 18 of chips 10 to form defined surface structure 20. According to one example, as described above, the step-wise etching process can be employed to form defined surface structure 20 along the entire length of sidewalls 18 between backside surface 14 and frontside surface 16, or only along a portion of the length of sidewalls 18 between backside surface 14 and frontside surface 16. In other examples, scallop features of defined surface structure 20 of a sidewall 18 of a same semiconductor chip 10 can have different spacings S and depths D. For example, the spacing S and depth D of the scallop features of defined surface structure may be made progressively smaller along sidewall 18 from backside 14 toward frontside 16.

Figure 10F:
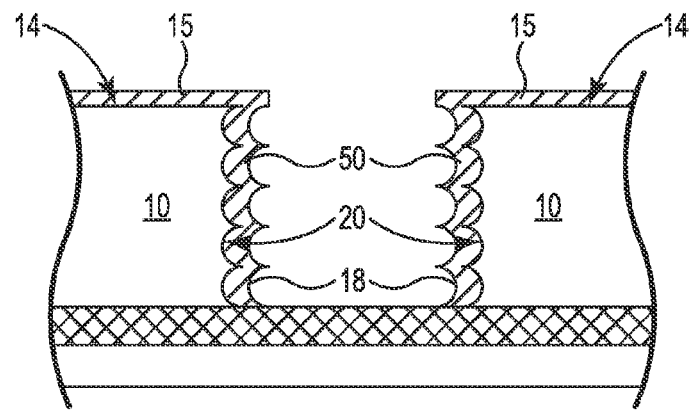

At FIG. 10F, after etching has been completed, protective layer 50 is deposited on sidewalls 18 over defined surface structure 20 and on backsides 14 to form backside electrode 15. In other examples, as described above, the material of protective layer 50 may be different than that of backside electrode 15. In other examples, semiconductor chips 10 may not include a backside electrode 50, such that protective layer 50 is deposited only on sidewalls 18 of semiconductor chips 10. After deposition of protective layer 50, and/or backside electrode 15, semiconductor chips 10 are removed from carrier 70 and mounted to carriers (e.g. leadframes) during assembly of semiconductor components, such as illustrated by FIGS. 8A through 9C.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor chip comprising:
    a body including:
        a frontside;
        a backside opposite the frontside; and
        sidewalls extending between the backside and frontside, at least a portion of each sidewall having a defined surface structure with hydrophobic characteristics to inhibit travel of a bonding material along the sidewalls during attachment of the semiconductor chip to a carrier with the bonding material.
2. The semiconductor chip of claim 1, wherein the defined surface structure extends along at least a portion of each sidewall beginning at an edge formed between the backside and the sidewall.
3. The semiconductor chip of claim 1, wherein the defined surface structure is a hydrophobic surface.
4. The semiconductor chip of claim 1, wherein the defined surface structure comprises a corrugated surface structure.
5. The semiconductor chip of claim 4, wherein the corrugated surface comprises a plurality of scallops extending across each sidewall parallel to the frontside and backside.
6. The semiconductor chip of claim 1, wherein the defined surface structure transition includes features transitioning between high points and low points, as measured in a direction normal to the sidewalls, to provide a solid-liquid contact angle greater than 90 degrees.
7. The semiconductor of claim 6, wherein the surface features have a spatial modulation, including a spacing between the features and a depth of the features, defined as a difference between the high points and low points the direction normal to the sidewalls, wherein the spatial modulation of the surface features is adjusted based on an expected viscosity of the bonding material when liquid.
8. The semiconductor chip of claim 7, wherein the spacing between the features and depth of the features is increased with decreasing viscosity.

9. The semiconductor chip of claim 1, wherein the body comprises a semiconductor material, and wherein the defined surface structure is formed in the semiconductor material.
10. The semiconductor chip of claim 9, wherein the defined surface structure is coated with a protective layer.
11. The semiconductor chip of claim 10, wherein the protective layer comprises a passivation layer.
12. The semiconductor chip of claim 10, wherein the protective layer comprises a diffusion barrier.
13. The semiconductor chip of claim 1, wherein the body comprises a semiconductor material, wherein the semiconductor material of sidewalls of the body are coated with a protective layer, and wherein the surface structure is formed in the protective layer.
14. A method of fabricating a semiconductor chip comprising:
    defining the semiconductor chip having sidewalls; and
    forming a hydrophobic surface structure along at least a portion of each sidewall of the semiconductor chip,
    wherein forming the hydrophobic surface structure includes forming a corrugated surface structure transitioning between high points and low points, as measured in a direction to the sidewalls, each low point extending laterally across a sidewall.
15. The method of claim 14, wherein forming the hydrophobic surface structure includes providing the corrugated surface with a solid-liquid contact angle greater than 90 degrees.
16. The method of claim 15, wherein a distance between adjacent high points and a distance between a high point and low point is adjusted based on liquid properties of a bonding material to be used to attach the semiconductor chip to a carrier.
17. The method of claim 15, wherein the corrugated surface structure comprises a series of scallop features having a spacing and depth.
18. The method of claim 17, wherein the series of scallop features are formed using a series of Bosch etching steps to singulate the semiconductor chip from a semiconductor wafer.
19. The method of claim 18, wherein a duration of each of the Bosch etching steps of the series of Bosch etching steps is varied to control the spacing depth of the scallop features.
20. The method of claim 15, wherein the corrugated surface comprises a series of parallel channels, the method including forming the parallel channels by scratching each sidewall.
21. The method of claim 14, including forming the hydrophobic surface structure using a wet chemical etching process.
22. The method of claim 14, including depositing a passivation layer over the hydrophobic surface structure.
23. A semiconductor chip comprising:
    sidewalls extending between a backside and frontside of the semiconductor chip, at least a portion of each sidewall having a defined hydrophobic surface structure to inhibit travel of a bonding material along the sidewalls during attachment of the semiconductor chip to a carrier with the bonding material.

* * * * *